(12) United States Patent
Zhou

(10) Patent No.: US 10,930,765 B2
(45) Date of Patent: Feb. 23, 2021

(54) METHOD OF MANUFACTURING FINFET DEVICE WITH NON-RECESSED STI

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/836,860

(22) Filed: Mar. 31, 2020

(65) Prior Publication Data
US 2020/0279936 A1    Sep. 3, 2020

Related U.S. Application Data

(62) Division of application No. 15/918,719, filed on Mar. 12, 2018, now Pat. No. 10,644,135.

(30) Foreign Application Priority Data

Apr. 26, 2017    (CN) .......................... 201710279678.1

(51) Int. Cl.
*H01L 29/66* (2006.01)
*H01L 21/762* (2006.01)
(Continued)

(52) U.S. Cl.
CPC .. *H01L 29/66795* (2013.01); *H01L 21/76224* (2013.01); *H01L 29/0847* (2013.01);
(Continued)

(58) Field of Classification Search
CPC ................................................. H01L 29/66545
See application file for complete search history.

(56) References Cited

U.S. PATENT DOCUMENTS 9,412,616 B1    8/2016   Xie et al.
9,502,411 B1 *  11/2016  Doris ................... H01L 21/845
(Continued)

OTHER PUBLICATIONS

U.S. Appl. No. 15/918,719, Non-Final Office Action, dated Jul. 16, 2019, 19 pages.
(Continued)

*Primary Examiner* — Victoria K. Hall
(74) *Attorney, Agent, or Firm* — Anova Law Group, PLLC

(57) ABSTRACT

A method of manufacturing a semiconductor device includes providing a semiconductor structure having a substrate and a semiconductor fin on the substrate, forming a dummy gate structure on the semiconductor fin, forming a first dielectric layer on the semiconductor structure exposing an upper surface of the dummy gate structure, removing the dummy gate structure and a portion of the semiconductor fin below the dummy gate structure to form a trench that divides the semiconductor fin into a first portion and a second portion spaced apart from each other, and forming a second dielectric layer on the semiconductor structure filling the trench. The method provides a semiconductor device having a non-recessed trench isolation structure.

19 Claims, 8 Drawing Sheets

(51) Int. Cl.
*H01L 29/78* (2006.01)
*H01L 29/08* (2006.01)

(52) U.S. Cl.
CPC ...... *H01L 29/66545* (2013.01); *H01L 29/785* (2013.01); *H01L 29/7848* (2013.01)

(56) References Cited

U.S. PATENT DOCUMENTS

| | | | |
|---|---|---|---|
| 9,653,583 B1 | 5/2017 | Zhao et al. | |
| 10,074,571 B1* | 9/2018 | Greene | H01L 21/823431 |
| 10,163,904 B1* | 12/2018 | Liaw | H01L 21/823821 |
| 10,388,652 B2 | 8/2019 | Shi et al. | |
| 10,431,498 B2* | 10/2019 | Zhou | H01L 29/6656 |
| 10,483,263 B2* | 11/2019 | Zhou | H01L 21/0337 |
| 10,490,458 B2 | 11/2019 | Perng et al. | |
| 10,522,414 B2 | 12/2019 | Chang et al. | |
| 10,607,882 B2* | 3/2020 | Hsu | H01L 29/66545 |
| 10,685,889 B2* | 6/2020 | Zhou | H01L 21/02244 |
| 10,741,654 B2* | 8/2020 | Li | H01L 29/4991 |
| 2015/0214341 A1* | 7/2015 | Shin | H01L 29/7851 257/401 |
| 2015/0325575 A1* | 11/2015 | Park | H01L 29/0653 257/401 |
| 2016/0190130 A1* | 6/2016 | Yu | H01L 21/823431 257/401 |
| 2017/0012000 A1* | 1/2017 | Tseng | H01L 29/0649 |
| 2017/0053980 A1* | 2/2017 | Liou | H01L 29/0649 |
| 2017/0054024 A1* | 2/2017 | Doris | H01L 21/845 |
| 2017/0309625 A1* | 10/2017 | Kim | H01L 21/823437 |
| 2017/0373120 A1* | 12/2017 | Zuliani | H01L 45/1293 |
| 2018/0166443 A1* | 6/2018 | Kim | H01L 23/53209 |
| 2018/0308769 A1* | 10/2018 | Chang | H01L 21/76232 |
| 2019/0013314 A1* | 1/2019 | Choi | H01L 21/823418 |
| 2019/0189523 A1* | 6/2019 | Zhu | H01L 21/823821 |
| 2019/0221469 A1* | 7/2019 | Hsu | H01L 21/76224 |
| 2019/0229019 A1* | 7/2019 | Shu | H01L 27/0886 |
| 2019/0259619 A1* | 8/2019 | Zang | H01L 29/4983 |
| 2019/0280114 A1 | 9/2019 | Gao et al. | |

OTHER PUBLICATIONS

U.S. Appl. No. 15/918,719, Notice of Allowance, dated Dec. 30, 2019, 9 pages.
U.S. Appl. No. 15/918,719, Corrected Notice of Allowability, dated Apr. 3, 2020, 6 pages.

* cited by examiner

METHOD OF MANUFACTURING FINFET DEVICE WITH NON-RECESSED STI

CROSS-REFERENCES TO RELATED APPLICATIONS

This application is a divisional of U.S. patent application Ser. No. 15/918,719, filed on Mar. 12, 2018, which claims priority to Chinese Patent Application No. 201710279678.1, filed with the State Intellectual Property Office of People's Republic of China on Apr. 26, 2017, the content of which is incorporated herein by reference in its entirety.

FIELD OF THE INVENTION

The present invention relates to integrated semiconductor devices, and more particularly to a fin field effect transistor and method for manufacturing the same.

BACKGROUND OF THE INVENTION

Fin field effect transistors (FinFETs) have improved performance, or reduced supply voltage, and can significantly reduce the short channel effect. But, FinFETs also have some drawbacks that need to be overcome.

For N-channel metal oxide semiconductor (NMOS) and P-channel metal oxide semiconductor (PMOS), raised source and drain need to be formed. Among them, silicon germanium (SiGe) is used in PMOS devices, and silicon carbide (SiC) is used for NMOS devices. SiGe and SiC may introduce greater channel stress and reduce the contact resistance.

However, the epitaxial body formed as a source or a drain at the edge of the fin has an irregular form that affects the uniformity and performance of the device. Therefore, it is presently necessary to form a dummy gate to cover the edge of an active area of the fin, thereby avoiding irregular epitaxial problems.

FIG. 1A is a cross-sectional view of a semiconductor device according to the prior art. Referring to FIG. 1A, the semiconductor device includes fins 101, a shallow trench isolation (STI) 105 between fins 101, a dummy gate 102 on fins 101, a dummy gate 103 on STI 105, and a spacer material 104 on sidewalls of the dummy gates. In order to reduce the surface area of a design circuit, a single dummy gate 103 is formed on STI 105. But this causes the problem that spacer material 104 does not completely cover the edge of the fins, resulting in irregularities in the epitaxial body at the edge of the fins (as shown by the dotted circle in FIG. 1A), thereby affecting the device performance.

In order to solve the above-described problems, a non-recessed STI 105 process is required for the design of a single dummy gate, and may be referred to as a single diffusion break process, as shown in FIG. 1B.

BRIEF SUMMARY OF THE INVENTION

In one aspect of the present invention, a method for manufacturing a semiconductor device that provides a non-recessed shallow-trench isolation structure. The method may include providing a semiconductor structure including a substrate and a semiconductor fin on the substrate, forming a dummy gate structure on the semiconductor fin, forming a first dielectric layer on the semiconductor structure exposing an upper surface of the dummy gate structure, removing the dummy gate structure and a portion of the semiconductor fin below the dummy gate structure to form a trench that divides the semiconductor fin into a first portion and a second portion spaced apart from each other, and forming a second dielectric layer on the semiconductor structure filling the trench.

In one embodiment, the method may further include forming a first initial gate structure and a second initial gate structure on the semiconductor fin on opposite sides of the dummy gate structure, the first and second initial gate structures are spaced apart from the dummy gate structure.

In one embodiment, the method may further include forming a first hardmask layer on the dummy gate structure and the first and second initial gate structures, and forming spacers on sidewalls of the dummy gate structure and on sidewalls of the first and second initial gate structures.

In one embodiment, the method may further include forming a first electrode and a second electrode on opposite sides of the first initial gate structure and a third electrode and a fourth electrode on opposite sides of the second initial gate structure. The second electrode is disposed between the first initial gate structure and the dummy gate structure, and the third electrode is disposed between the second initial gate structure and the dummy gate structure.

In one embodiment, the method may further include forming a first contact, a second contact, a third contact, and a fourth contact extending through the first dielectric layer and the second dielectric layer to connect to the first electrode, the second electrode, the third electrode, and the fourth electrode, respectively.

In one embodiment, the method may further include, after forming the dummy gate structure, the first initial gate structure and the second initial gate structure, forming a first dielectric layer on the semiconductor structure, and planarizing the first dielectric layer to expose an upper surface of the dummy gate structure, an upper surface of the first initial gate structure, and an upper surface of the second initial gate structure.

In one embodiment, the dummy gate structure includes a dummy gate insulator layer on the semiconductor fin and a dummy gate on the dummy gate insulator layer. The first initial gate structure includes a first initial gate insulator layer on the semiconductor fin and a first initial gate on the first initial gate insulator layer. The second initial gate structure includes a second initial gate insulator layer on the semiconductor fin and a second initial gate on the second initial gate insulator layer. The upper surface of the dummy gate structure is an upper surface of the dummy gate, the upper surface of the first initial gate structure is an upper surface of the first initial gate, and the upper surface of the second initial gate structure is an upper surface of the second initial gate.

In one embodiment, the method may further include, prior to forming the trench, removing the first initial gate structure and the second initial gate structure to form a first recess in a location of the removed first initial gate structure and a second recess in a location of the removed second initial gate structure, forming a first gate structure in the first recess and a second gate structure in the second recess, removing a top portion of the first gate structure to form a third recess and a top portion of the second gate structure to form a fourth recess, the third recess having a depth less than a depth of the first recess, and the fourth recess having a depth less than a depth of the second recess, and forming a second hardmask layer on an upper surface of the first gate structure and an upper surface of the second gate structure.

In one embodiment, the first gate structure is disposed on the first portion, the first electrode and the second electrode are disposed in the first portion, the second gate structure is disposed on the second portion, the third electrode and the fourth electrode are disposed in the second portion.

In one embodiment, forming the first recess and the second recess includes forming a patterned mask layer on the first dielectric layer covering the dummy gate and exposing an upper surface of the first initial gate and an upper surface of the second initial gate, removing the first initial gate and the second initial gate using the patterned mask layer as a mask, removing the patterned mask layer, and removing the first initial gate insulator layer and the second initial gate insulator layer to form the first recess and the second recess.

In one embodiment, forming the second hardmask layer includes forming the second hardmask layer filling the third recess and the fourth recess, and planarizing the second hardmask layer to expose an upper surface of the dummy gate. A remaining portion of the second hardmask layer includes a first hardmask portion disposed on the first gate structure and a second hardmask portion disposed on the second gate structure.

In one embodiment, the trench has a depth in a range between 2000 angstroms and 4000 angstroms, and a first trench portion between the first portion and the second portion and a second trench portion above the first trench portion. The first trench portion has a depth in a range between 1000 angstroms and 2000 angstroms, and the second trench portion has a depth in a range between 1000 angstroms and 2000 angstroms.

In one embodiment, the method may further include forming a trench isolation portion on the substrate and surrounding the semiconductor fin, the trench isolation portion having a bottom substantially flush with a bottom of the trench.

Embodiments of the present invention also provide a semiconductor device, which includes a substrate, a semiconductor fin on the substrate, a first dielectric layer on the semiconductor fin, a trench on the substrate and in the semiconductor fin and the first dielectric layer, the trench dividing the semiconductor fin into a first portion and a second portion that are spaced apart from each other, and a second dielectric layer on the first dielectric layer and filling the trench.

In one embodiment, the semiconductor device also includes a first gate structure and a second gate structure on opposite sides of the trench, the first gate structure being on the first portion and the second gate structure being on the second portion.

In one embodiment, the semiconductor device also includes a hardmask layer on an upper surface of the first gate structure and on an upper surface of the second gate structure, and a spacer on sidewalls of the first gate structure and the second gate structure.

In one embodiment, the semiconductor device also includes a first electrode and a second electrode on opposite sides of the first gate structure, and a third electrode and a fourth electrode on opposite sides of the second gate structure.

In one embodiment, the semiconductor device also includes a first contact, a second contact, a third contact, and a fourth contact each extending through the first dielectric layer and the second dielectric layer and connecting to a first electrode, a second electrode, a third electrode, and a fourth electrode, respectively.

In one embodiment, the trench has a depth in a range between 2000 angstroms and 4000 angstroms, and a first trench portion between the first portion and the second portion and a second trench portion above the first trench portion. The first trench portion has a depth in a range between 1000 angstroms and 2000 angstroms, and the second trench portion has a depth in a range between 1000 angstroms and 2000 angstroms.

In one embodiment, the semiconductor device also includes a trench isolation portion on the substrate and surrounding the semiconductor fin, the trench isolation portion having a bottom that is substantially flush with a bottom of the trench.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1A:
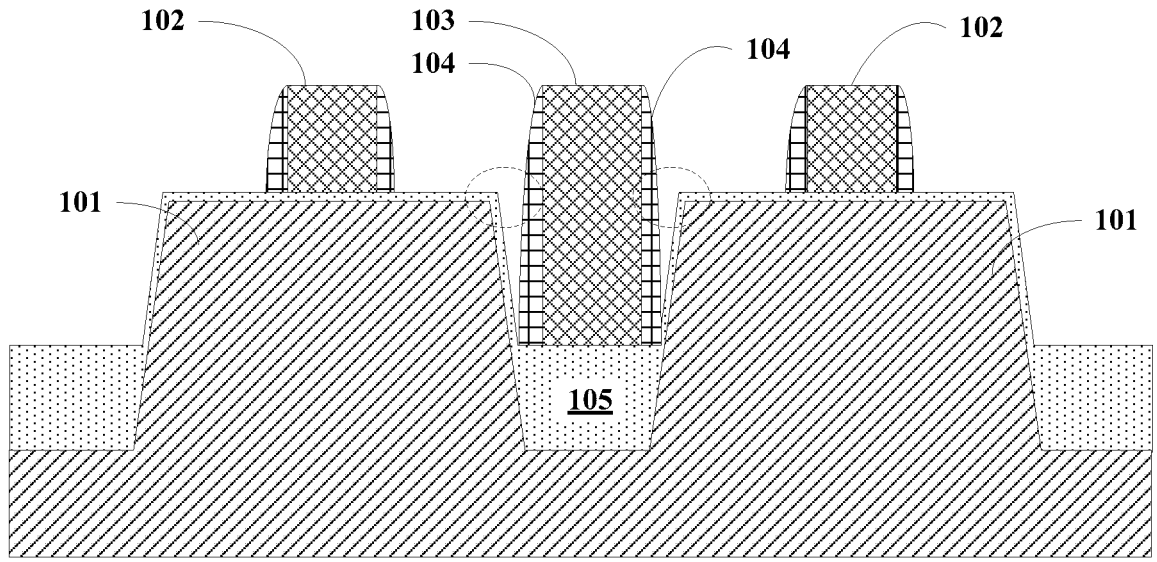
FIG. 1A is a cross-sectional view illustrating a semiconductor device manufactured with a conventional method according to the prior art.
Figure 1B:
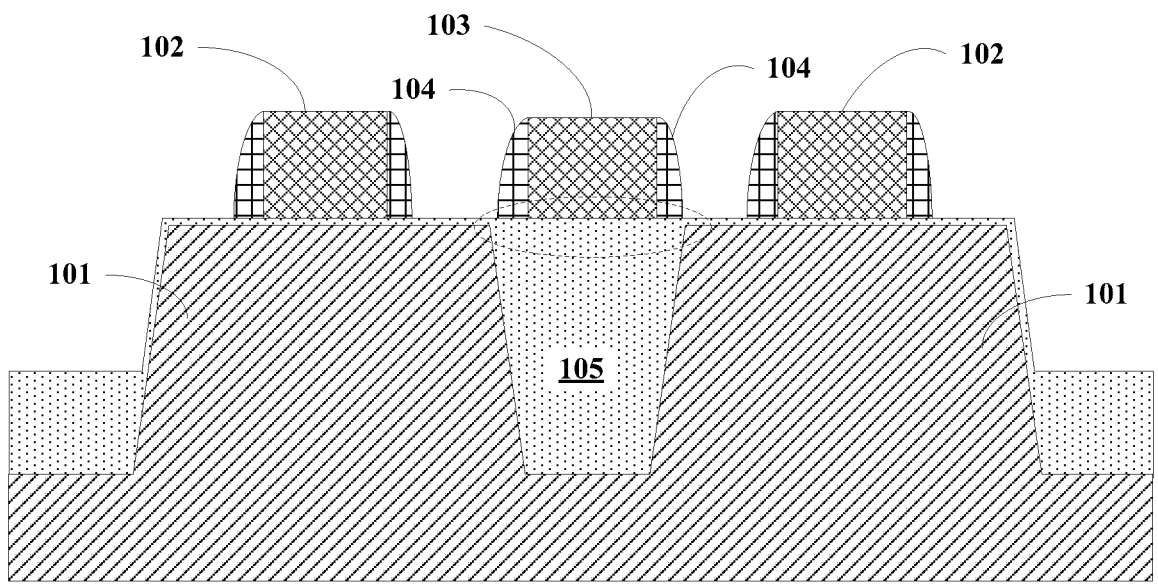
FIG. 1B is a cross-sectional view illustrating a semiconductor device manufactured with another conventional method according to the prior art.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Figure 2:
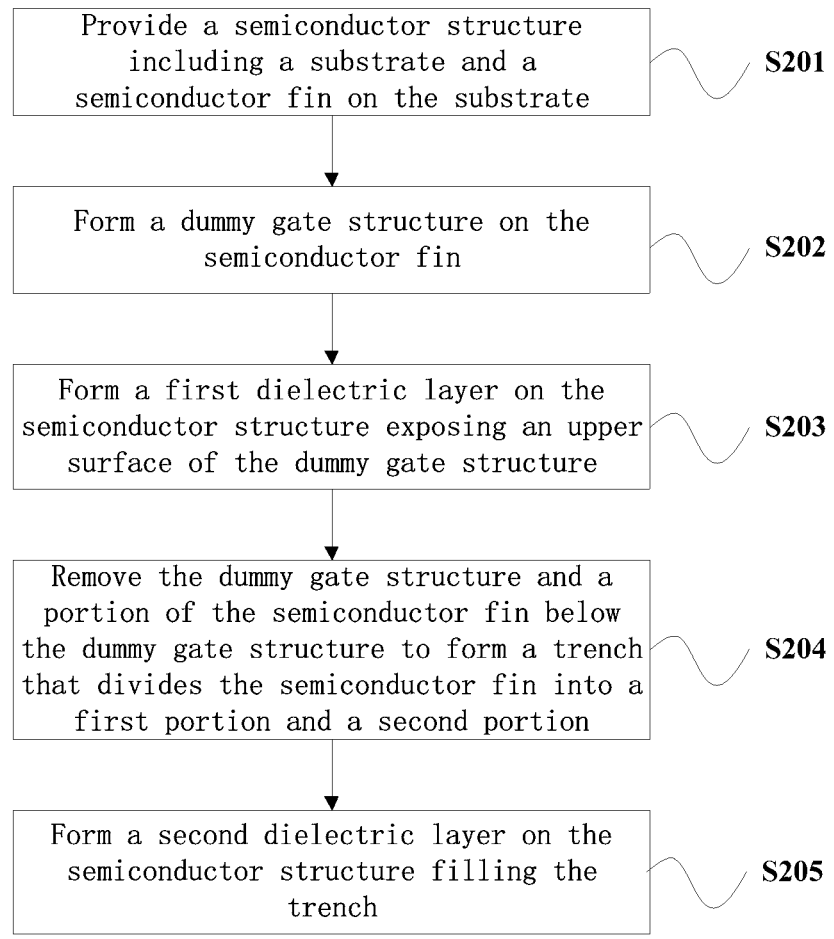
FIG. 2 is a flowchart of a method for manufacturing a semiconductor device according to one embodiment of the present invention.

FIG. 2 is a flowchart of a method for manufacturing a semiconductor device according to an embodiment of the present invention. Referring to FIG. 2, the method include:

S201: providing a semiconductor structure including a substrate and a semiconductor fin on the substrate.

S202: forming a dummy gate structure on the semiconductor fin. For example, the dummy gate structure may include a dummy gate insulating layer on the surface of the semiconductor fin and a dummy gate on the dummy gate insulating layer.

S203: forming a first dielectric layer on the semiconductor structure exposing an upper surface of the dummy gate structure.

S204: removing the dummy gate structure and a portion of the semiconductor fin below the dummy gate structure to form a trench that divides the fin into a first portion and a second portion.

S205: forming a second dielectric layer on the semiconductor structure filling the trench.

A method for manufacturing a semiconductor device is thus provided. In the method, a dummy gate structure is first formed on the semiconductor fin, and a first dielectric layer is then formed on the semiconductor structure while exposing an upper surface of the dummy gate structure. Next, the dummy gate structure and a portion of the underlying semiconductor fin below the dummy gate structure are removed (e.g., by etching) to form a trench that divides the semiconductor fin into two portions (e.g., first and second portions). Thereafter, a second dielectric layer is formed filling the trench, thereby forming a non-recessed trench isolation structure. The non-recessed trench isolation structure may be operative as a non-recessed shallow trench isolation (STI), thereby forming a single diffusion break (SDB) isolation structure.

FIGS. 3, 4, 5A, 5B, and 6 through 18 are cross-sectional views illustrating intermediate stages of a structure of a manufacturing method of a semiconductor device according to an embodiment of the present invention. The manufacturing method of the semiconductor device according to an embodiment of the present invention will be described in detail below with references to FIGS. 3, 4, 5A, 5B, and 6 through 18.

First, a semiconductor structure is provided. The process of providing the semiconductor structure will be described with reference to FIGS. 3, 4, 5A and 5B.

Figure 3:
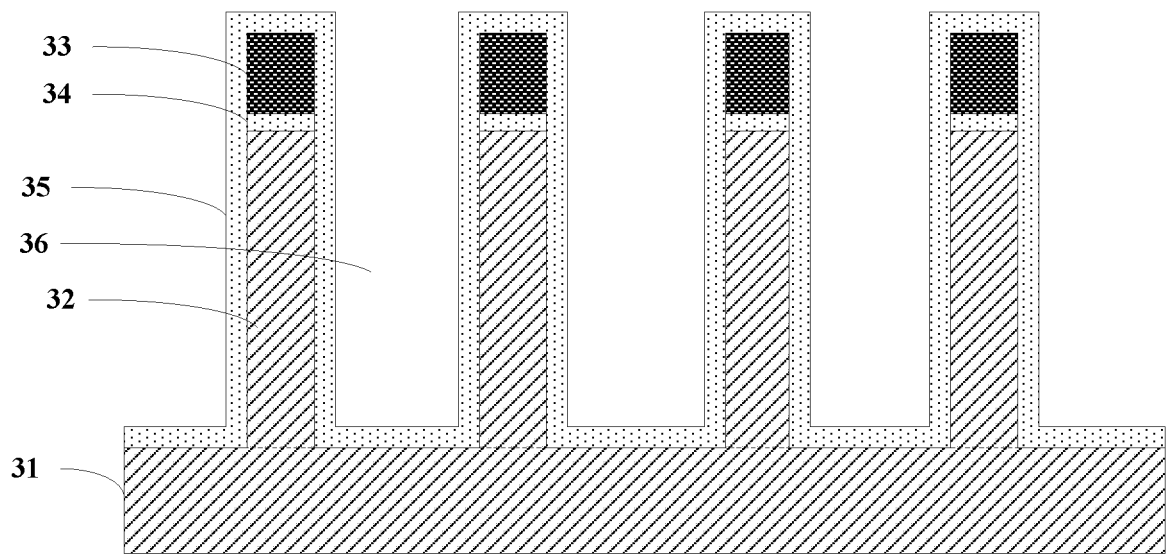
FIG. 3 is a cross-sectional view illustrating an initial structure of a manufacturing method of a semiconductor device according to an embodiment of the present invention.

Referring to FIG. 3, an initial structure is provided. The initial structure may include a substrate (e.g., silicon substrate) 31, a semiconductor (e.g., silicon) fin 32 on substrate 31, a first insulator layer (e.g., silicon dioxide) 34 on the semiconductor fin, an initial hard mask layer (e.g., silicon nitride) 33 on first insulator layer 34, and a recess 36 surrounding semiconductor fin 32. In one embodiment, the initial structure may also include a second insulator layer (e.g., silicon dioxide) 35 that covers semiconductor fins 32 and initial hard mask layer 33.

In one embodiment, the process of providing the initial structure may include providing a substrate 31, forming a first insulator layer 34 on substrate 31, forming a patterned initial hardmask layer 33 on first insulator layer 34. Hardmask layer 33 is operative as a mask for etching substrate 31 to form a plurality of semiconductor fins 32, and a second insulator layer 35 is then deposited on the semiconductor fins and the hardmask layer to form the initial structure of FIG. 3.

Figure 4:
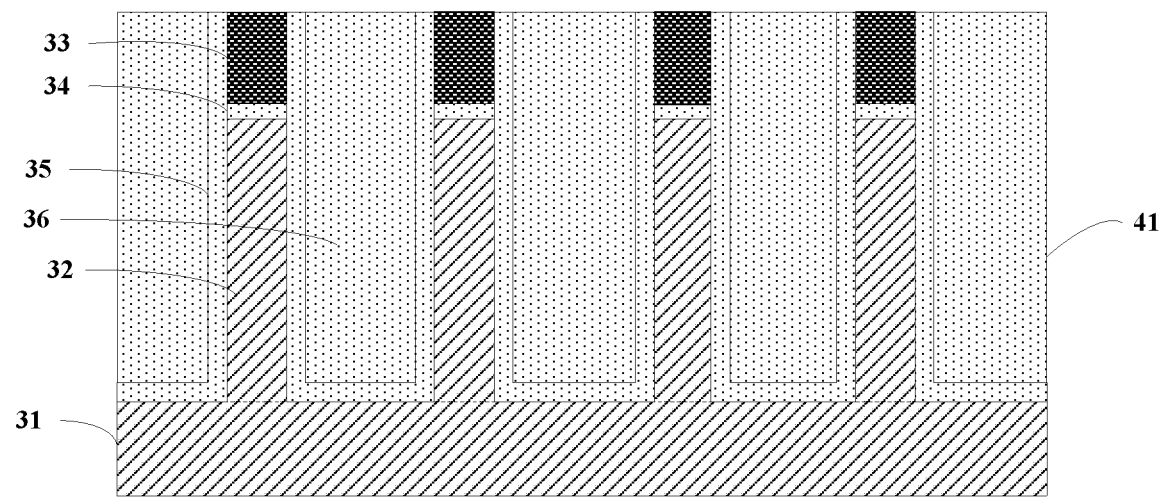
FIG. 4 is a cross-sectional view illustrating an intermediate stage of the initial structure having a deposition of a trench isolation layer and planarization according to an embodiment of the present invention.

Next, referring to FIG. 4, a trench isolation layer 41 is formed by, e.g., a flowable chemical vapor deposition (FCVD) process to fill recess 36. A planarization (e.g., a chemical mechanical polishing) process is then performed on trench isolation layer 41 to expose an upper surface of initial hardmask layer 33.

Figure 5A:
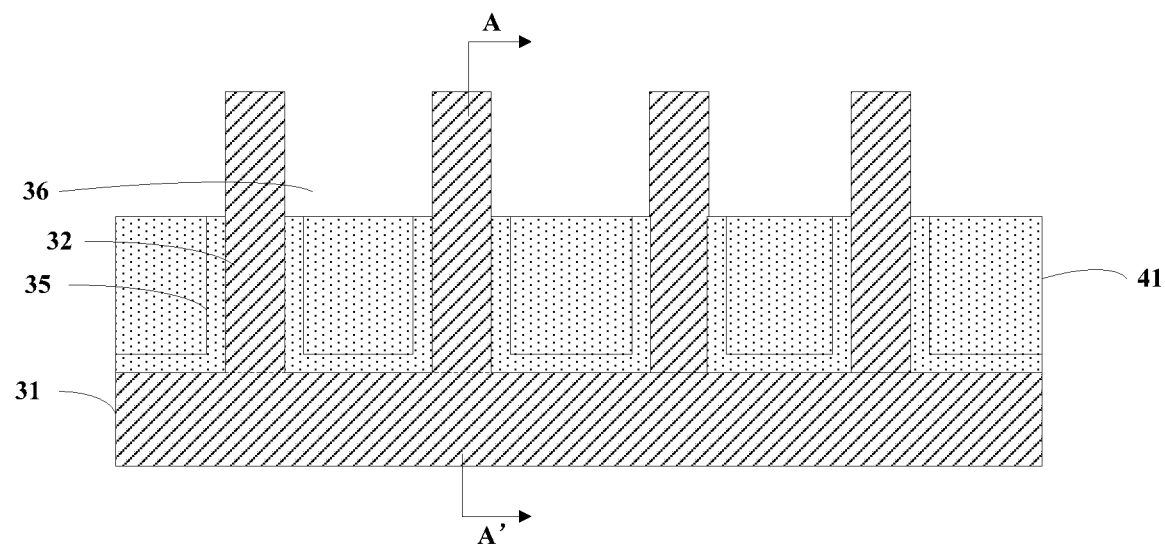
FIG. 5A is a cross-sectional view illustrating an intermediate stage of a structure of a manufacturing method of a semiconductor device having a trench isolation portion according to an embodiment of the present invention.
Figure 5B:
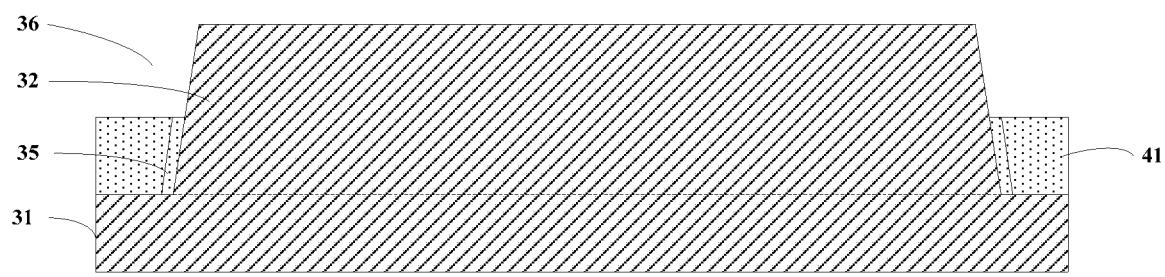
FIG. 5B is a cross-sectional view illustrating the structure of FIG. 5A taken along the line A-A'.

Next, referring to FIGS. 5A and 5B, trench isolation layer 41 is etched to expose a portion of semiconductor fin 32. During the etch process, a portion of second insulator layer 35 is also removed. Thereafter, initial hardmask layer 33 and first insulator layer 34 are removed to form a semiconductor structure shown in FIGS. 5A and 5B.

Referring to FIGS. 5A and 5B, the semiconductor structure may include a substrate 31 and semiconductor fin 32 on the substrate. In one embodiment, in the process of providing the semiconductor structure, the semiconductor structure may further include a trench isolation portion on substrate 31 and surrounding semiconductor fin 32. In the process, the trench isolation portion may include recess 36 surrounding semiconductor fin 32 and a trench isolation layer 41 partially filling recess 36.

Figure 6:
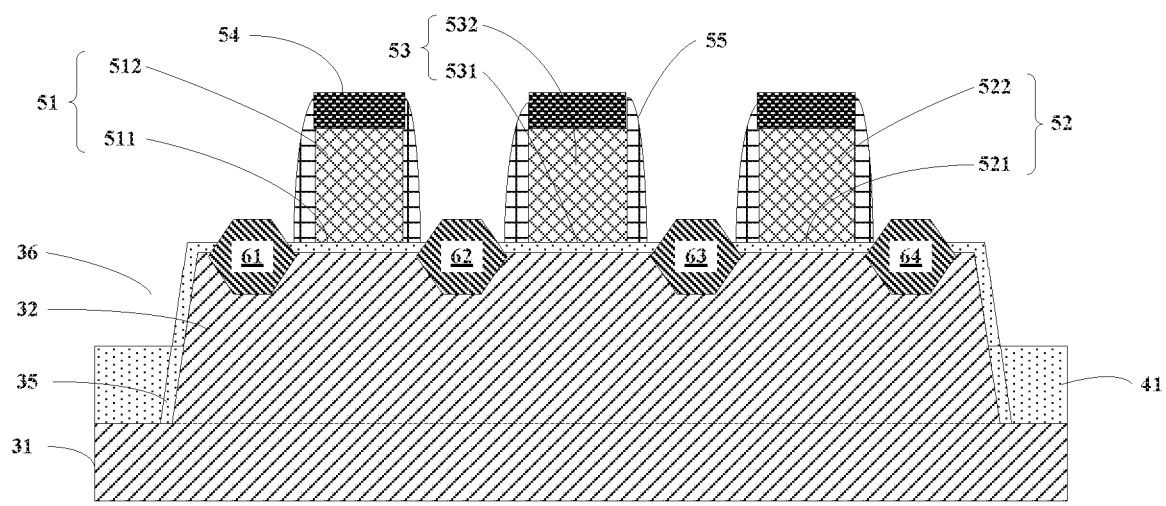
FIG. 6 is a cross-sectional view illustrating an intermediate stage of a structure of a manufacturing method of a semiconductor device having a dummy gate structure and first and second initial gate structures according to an embodiment of the present invention.

Next, referring to FIG. 6, a dummy gate structure 53 is formed on semiconductor fin 32. For example, dummy gate structure 53 may include a dummy gate insulator layer (e.g., silicon dioxide) 531 on the surface of semiconductor fin 32 and a dummy gate (e.g., polysilicon) 532 on dummy gate insulator layer 531.

In one embodiment, in the process of forming the dummy gate structure, a first initial gate structure 51 and a second initial gate structure 52 may also be formed on semiconductor fin 32 and on opposite sides of dummy gate structure 53. First initial gate structure 51 and second initial gate structure 52 are spaced apart (separated) from dummy gate structure 53. First initial gate structure 51 may include a first initial gate insulator layer (e.g., silicon dioxide) 511 on the surface of semiconductor fin 32 and a first initial gate (e.g., polysilicon) 512 on first initial gate insulator layer 511. Second initial gate structure 52 may include a second initial gate insulator (e.g., silicon dioxide) 521 on the surface of semiconductor fin 32 and a second initial gate layer (e.g., polysilicon) 522 on second initial gate insulator layer 521.

In one embodiment, in the process of forming dummy gate structure 53, first initial gate structure 51, and second initial gate structure 52, a first hardmask layer (e.g., silicon nitride) 54 may also be formed on dummy gate structure 53, first initial gate structure 51, and second initial gate structure 52; and a spacer (e.g., silicon oxide or silicon nitride) 55 may be formed on sidewalls of dummy gate structure 53, first initial gate structure 51, and second initial gate structure 52.

For example, the process of forming the dummy gate structure, the first initial gate structure, and the second initial gate structure may include forming a silicon dioxide layer on semiconductor fin 32, and then forming a polysilicon layer on the silicon dioxide layer. Thereafter, a patterned first hardmask layer is formed on the polysilicon layer, and an etching process is performed on the polysilicon layer using the first hardmask layer as a mask to form a dummy gate structure, a first initial gate structure, and a second initial gate structure. Next, a spacer is formed on sidewalls of the dummy gate structure, the first initial gate structure, and the second initial gate structure.

In one embodiment, referring to FIG. 6, after forming the dummy gate structure, the first initial gate structure, and the second initial gate structure, the method may further include forming a first electrode 61 and a second electrode 62 on opposite sides of first initial gate structure 51 of semiconductor fin 32, and forming a third electrode 63 and a fourth electrode 64 on opposite sides of second initial gate structure 52 of semiconductor fin 32. Second electrode 62 is disposed between first gate structure 51 and dummy gate structure 53. Third electrode 63 is disposed between second gate structure 52 and dummy gate structure 53. For example, first electrode 61 and fourth electrode 64 may be source electrodes, and second electrode 62 and third electrode 63 may be drain electrodes.

In one exemplary embodiment, an etch process may be performed on semiconductor fin 32 to form a recess on opposite sides of first initial gate structure 51 and on opposite sides of second initial gate structure 52. In one exemplary embodiment, a total of four recesses are formed. Thereafter, electrodes are formed in the four recesses using an epitaxial process, i.e., first electrode 61, second electrode 62, third electrode 63, and fourth electrode 64.

Next, a first dielectric layer (e.g., an interlayer dielectric layer) is formed on the semiconductor structure shown in FIG. 6. The process of forming the first dielectric layer will be described below with reference to FIGS. 7 and 8.

Figure 7:
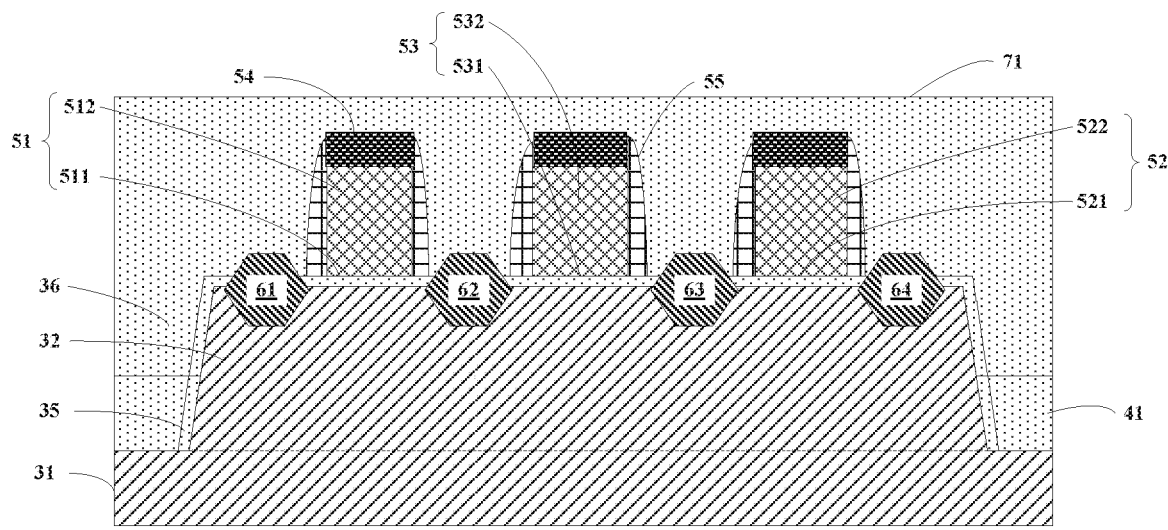
FIG. 7 is a cross-sectional view illustrating an intermediate stage of a structure of a manufacturing method of a semiconductor device after forming a first dielectric layer according to an embodiment of the present invention.

Referring to FIG. 7, the process of forming the first dielectric layer may include forming a first dielectric layer (e.g., silicon dioxide) 71 using a deposition process on the semiconductor structure after forming dummy gate structure 53, first initial gate structure 51, and second initial gate structure 52.

Figure 8:
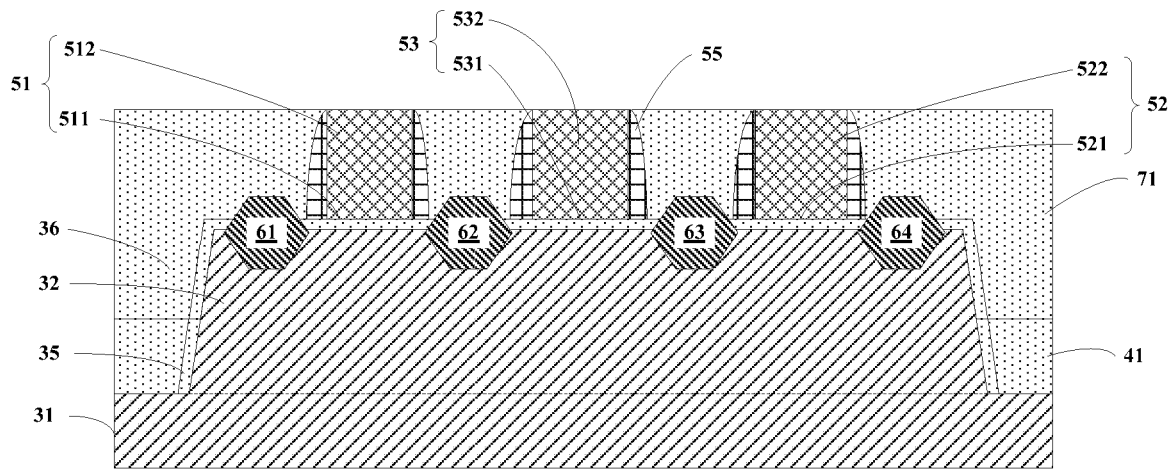
FIG. 8 is a cross-sectional view illustrating an intermediate stage of a structure of a manufacturing method of a semiconductor device after planarizing the first dielectric layer according to an embodiment of the present invention.

Next, referring to FIG. 8, the process of forming the first dielectric layer may also include performing a planarization (e.g., chemical mechanical polishing) process on first dielectric layer 71 to expose an upper surface of dummy gate structure 53, an upper surface of first initial gate structure 51, and an upper surface of second initial gate structure 52. The planarization process removes a portion of first dielectric layer 71 and first hardmask layer 54. The exposed upper surfaces of dummy gate structure 53, first initial gate structure 51, and second initial gate structure 52 are the upper surfaces of dummy gate 532, first initial gate 512, and second initial gate 522, respectively.

Next, first initial gate structure 51 and second initial gate structure 52 are removed to form a first recess and a second recess in the respective locations of the removed first initial gate structure and the second initial gate structure. The process of forming the first recess and second recess will be described below with reference to FIGS. 9 and 10.

Figure 9:
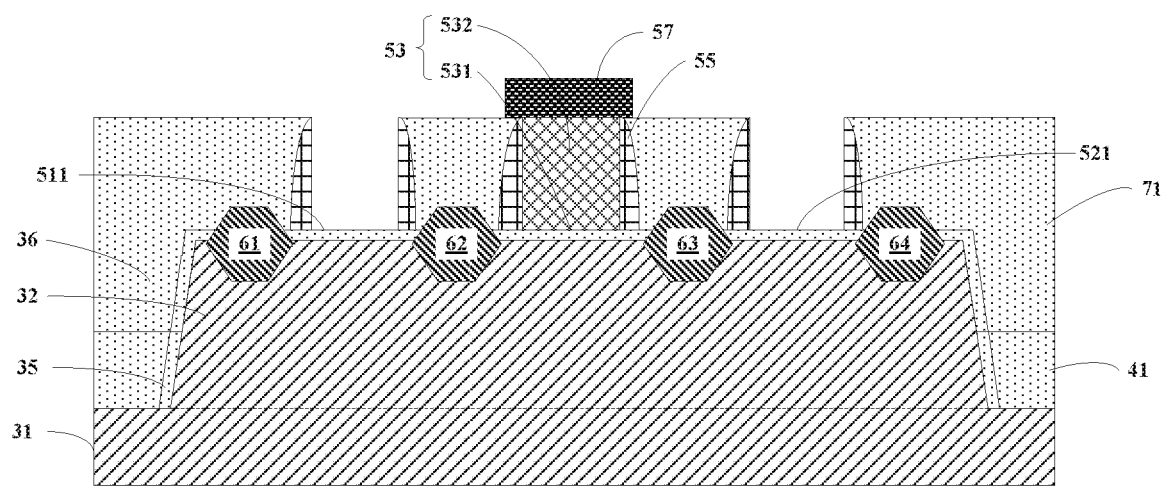
FIG. 9 is a cross-sectional view illustrating an intermediate stage of a structure of a manufacturing method of a semiconductor device after forming first and second recesses according to an embodiment of the present invention.

Referring to FIG. 9, a patterned mask layer 57 is formed on first dielectric layer 71 covering dummy gate 532 while exposing the upper surfaces of first and second initial gates 512 and 522. Then, first and second initial gates 512 and 522 are removed using mask layer 57 as a mask.

Figure 10:
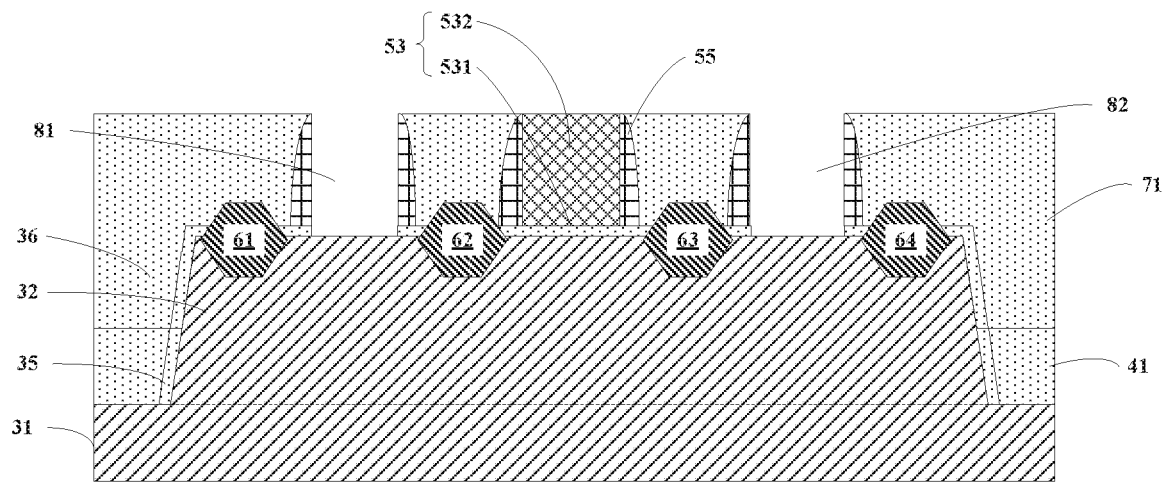
FIG. 10 is a cross-sectional view illustrating an intermediate stage of a structure of a manufacturing method of a semiconductor device having the patterned mask layer removed according to an embodiment of the present invention.
Figure 11:
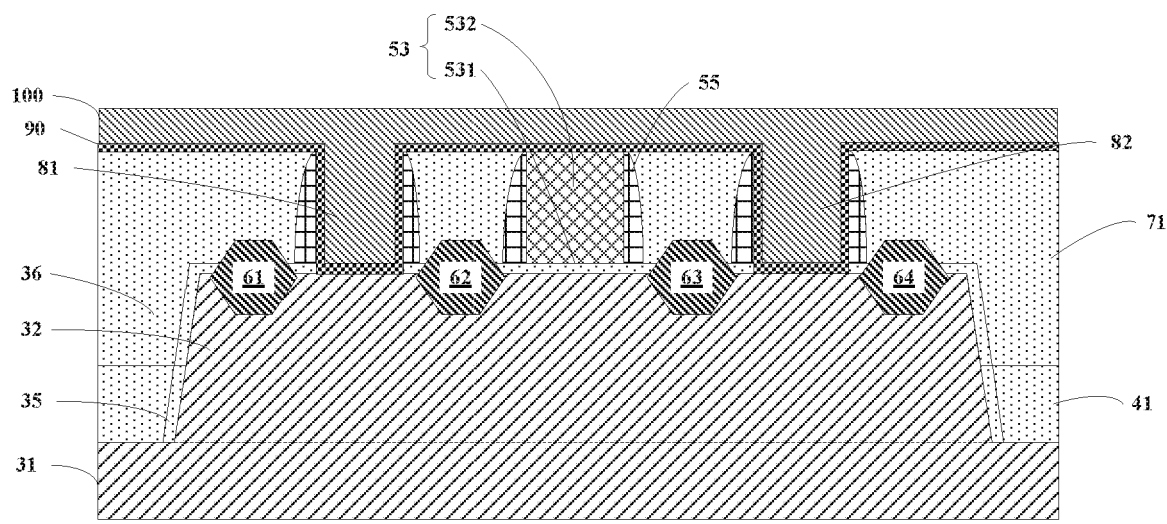
FIG. 11 is a cross-sectional view illustrating an intermediate stage of a structure of a manufacturing method of a semiconductor device after forming a gate dielectric layer and a gate layer according to an embodiment of the present invention.

Next, referring to FIG. 10, patterned mask layer 57 is removed. Thereafter, first initial gate insulating layer 511 and second initial gate insulating layer 512 are removed to form a first recess 81 and a second recess 82.

In another embodiment, a patterned mask layer 57 is formed on first dielectric layer 71 covering dummy gate 532 while exposing the upper surfaces of first and second initial gates 512 and 522. First and second initial gates 512, 522 and first and second gate insulating layer 511, 512 are then removed using mask layer 57 as a mask to form the structure shown in FIG. 10.

Figure 12:
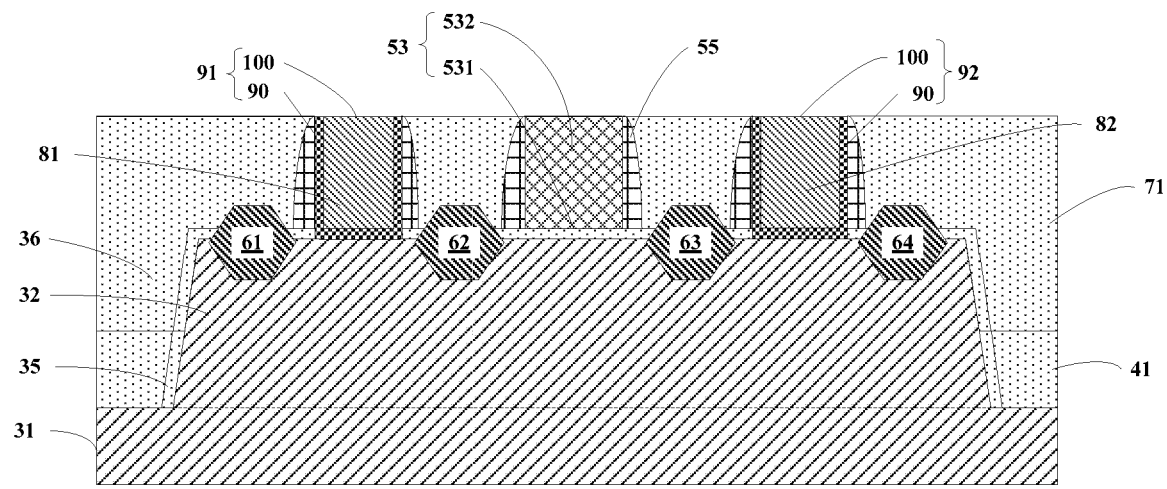
FIG. 12 is a cross-sectional view illustrating an intermediate stage of a structure of a manufacturing method of a semiconductor device after planarizing the gate dielectric layer and the gate layer according to an embodiment of the present invention.

Next, a first gate structure is formed in first recess 81 and a second gate structure is formed in second recess 82. In one embodiment, the process of forming the first and second gate structures may include sequentially forming a gate dielectric layer 90 and a gate layer 100 using a deposition process on the structure shown in FIG. 10 to form a structure shown in FIG. 11. In one embodiment, the gate dielectric layer may include a high dielectric constant material, and the gate layer may include a metal such as tungsten. In one embodiment, prior to forming the gate dielectric layer, it is also possible to form an interface layer, then a gate dielectric layer on the interface layer, and the gate layer on the gate dielectric layer. The process of forming the first and second gate structures may further include performing a planarization (e.g., CMP) process on gate layer 100 and gate dielectric layer 90 to remove a portion of gate layer 100 and a portion of gate dielectric layer 90 on first dielectric layer 71 to form a first gate structure 91 in first recess 81 and a second gate structure 92 in second recess 82, as shown in FIG. 12. First gate structure 91 and second gate structure 92 each include a gate dielectric layer 90 on semiconductor fin 32 and a gate electrode 100 on gate dielectric layer 90.

Figure 13:
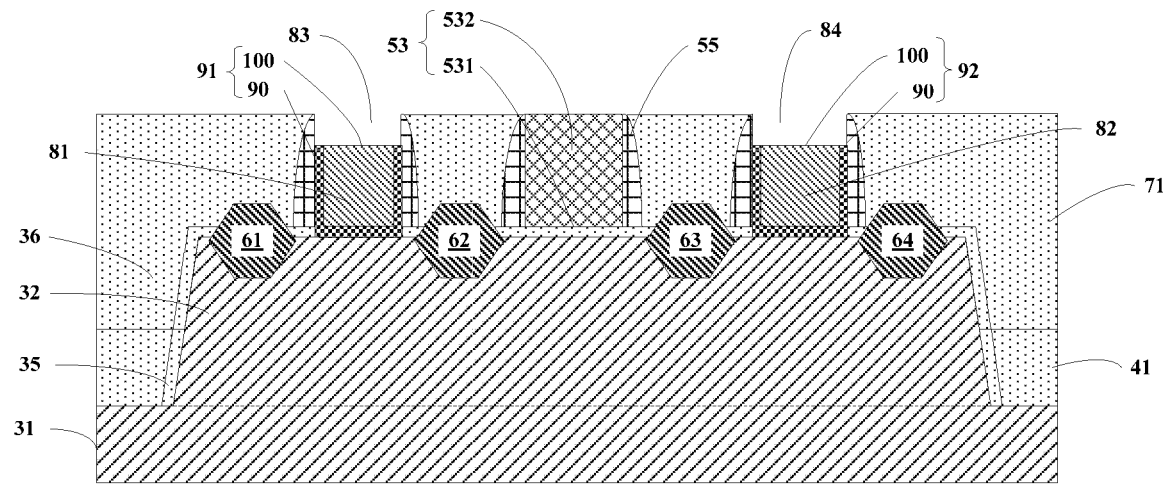
FIG. 13 is a cross-sectional view illustrating an intermediate stage of a structure of a manufacturing method of a semiconductor device after forming third and fourth recesses according to an embodiment of the present invention.

Next, referring to FIG. 13, a top portion of first gate structure 91 and a top portion of second gate structure 92 are etched to form a third recess 83 and a fourth recess 84, respectively. Third recess 83 has a depth that is smaller than the depth of first recess 81, and fourth recess 84 has a depth that is smaller than the depth of second recess 82. That is, only a top portion of first gate structure 91 and a top portion of second gate structure 92 are removed, and first gate structure 91 and second gate structure 92 are not completely removed.

Next, a second hardmask layer is formed on the upper surfaces of first gate structure 91 in third recess 83 and second gate structure 92 in fourth recess 84. The process of forming the second hardmask layer will be described in detail below with reference to FIGS. 14 and 15.

Figure 14:
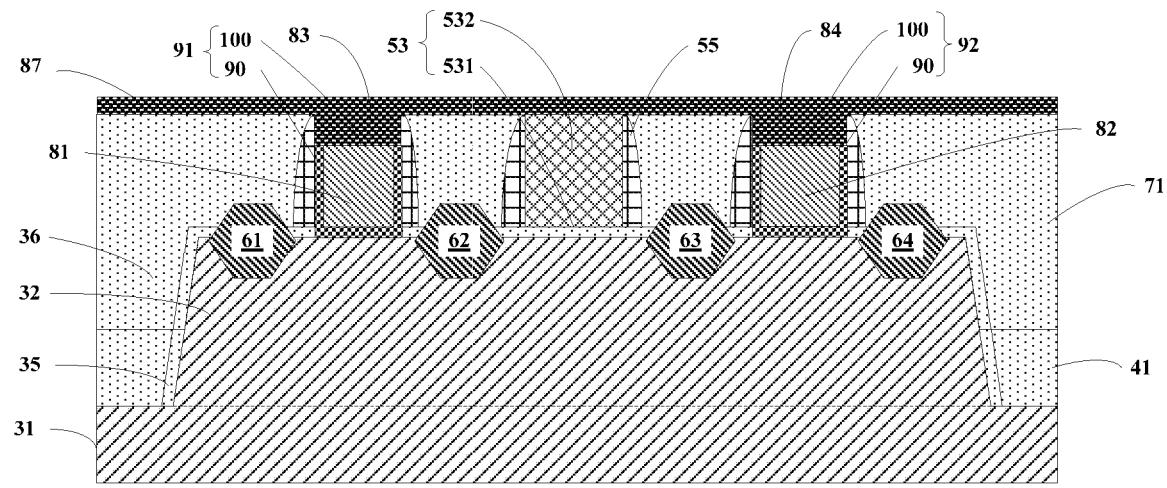
FIG. 14 is a cross-sectional view illustrating an intermediate stage of a structure of a manufacturing method of a semiconductor device after forming a second hardmask layer according to an embodiment of the present invention.
Figure 15:
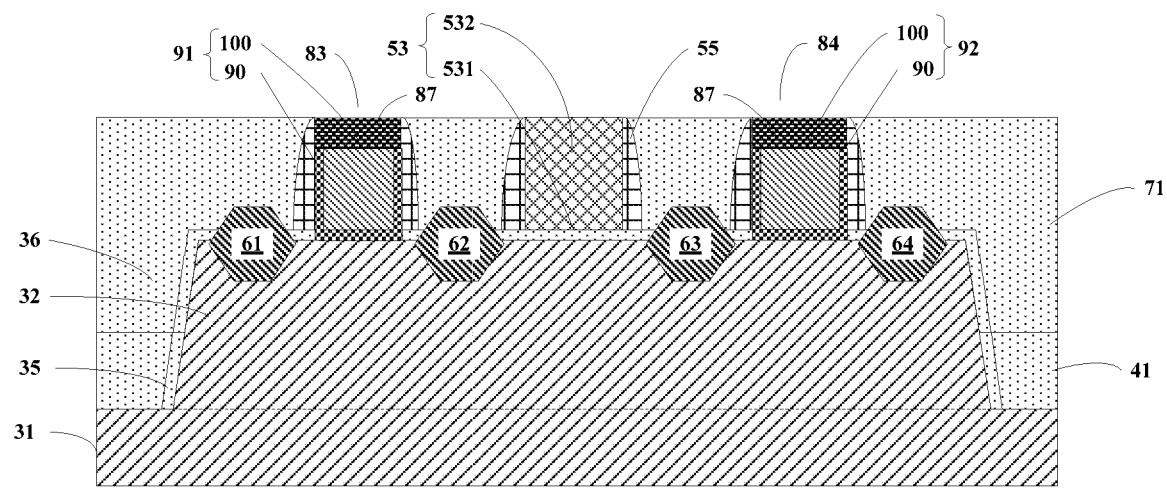
FIG. 15 is a cross-sectional view illustrating an intermediate stage of a structure of a manufacturing method of a semiconductor device after planarizing the second hardmask layer according to an embodiment of the present invention.

Referring to FIG. 14, the process of forming the second hardmask layer may include depositing a second hardmask layer (e.g., silicon nitride) 87 on the structure shown in FIG. 13 filling third recess 83 and fourth recess 84. Next, referring to FIG. 15, a planarization (e.g., CMP) process is performed on second hardmask layer 87 to expose an upper surface of dummy gate 532. A portion of a remaining second mask layer 87 is formed on first gate structure 91 and another portion of the remaining second mask layer 87 is formed on second gate structure 92.

Next, referring to FIG. 16, dummy gate structure 53 and a portion of semiconductor fin 32 below the dummy gate structure are removed using, e.g., an etching process, to form a trench 110. Trench 110 divides semiconductor fin 32 into a first portion 321 and a second portion 322. After forming trench 110, first gate structure 91 is disposed on first portion 321, first electrode 61 and second electrode 62 are at least partially disposed in first portion 321. Second gate structure 92 is disposed on second portion 322, and third electrode 63 and fourth electrode 64 are at least partially disposed in second portion 322.

In one embodiment, trench 110 has a bottom that is substantially flush with the bottom of the trench isolation portion (e.g., the bottom of recess 36). As used herein, the term 'substantially flush" includes, but is not limited to, the bottom of the trench being absolutely flush with the bottom of the trench isolation portion, for example, within an allowable process variation tolerance, the bottom of the trench may be slightly higher or slightly lower than the bottom of the trench isolation portion. By making the bottom of the trench substantially flush with the bottom of the trench isolation portion, it is possible to ensure that the first portion (321) and the second portion (322) are spaced apart from each other.

In one embodiment, trench 110 has a depth in the range between 2000 angstroms and 4000 angstroms (e.g., 2500 angstroms or 3000 angstroms).

Figure 16:
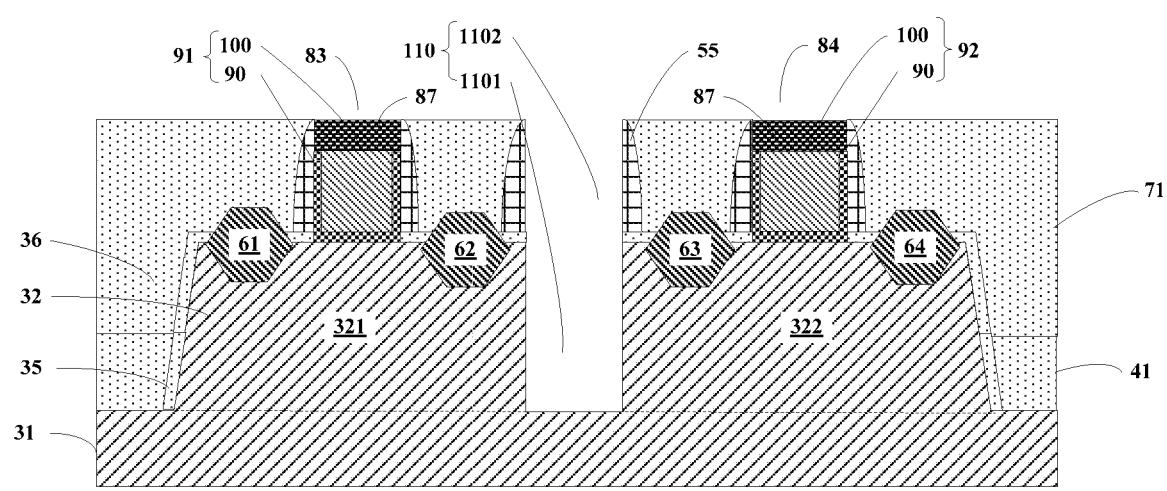
FIG. 16 is a cross-sectional view illustrating an intermediate stage of a structure of a manufacturing method of a semiconductor device after forming a trench according to an embodiment of the present invention.

In one embodiment, referring to FIG. 16, trench 110 may include a first trench portion 1101 disposed between first portion 321 and second portion 322 and a second trench portion 1102 above first trench portion 1101. First trench portion 1101 and second trench portion 1102 are aligned with each other. In one embodiment, first trench portion 1101 has a depth in the range between 1000 angstroms and 2000 angstroms (e.g., the depth of the first trench portion may be 1500 angstroms). In one embodiment, second trench portion 1102 has a depth in the range between 1000 angstroms and 2000 angstroms (e.g., the depth of the second trench portion may be 1500 angstroms).

Figure 17:
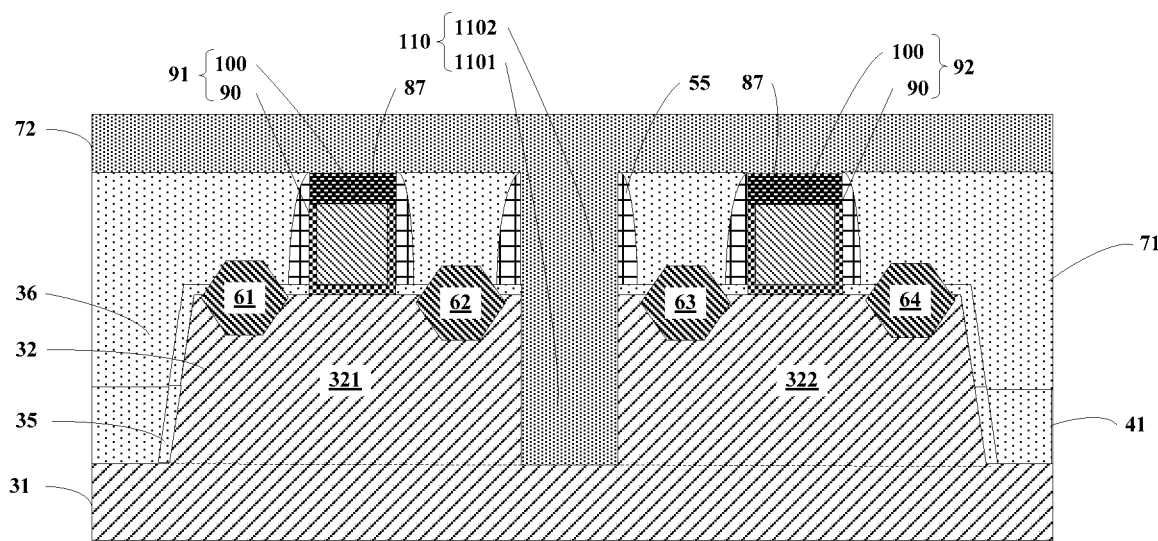
FIG. 17 is a cross-sectional view illustrating an intermediate stage of a structure of a manufacturing method of a semiconductor device after filling the trench according to an embodiment of the present invention.

Next, referring to FIG. 17, a second dielectric layer (e.g., an intermetal dielectric layer) 72 is formed by a deposition process on the semiconductor structure of FIG. 16. Second dielectric layer 72 fills trench 110 to form a non-recessed trench isolation structure, which is operative as, e.g., a shallow trench isolation (STI). The second dielectric layer may include silicon dioxide.

Figure 18:
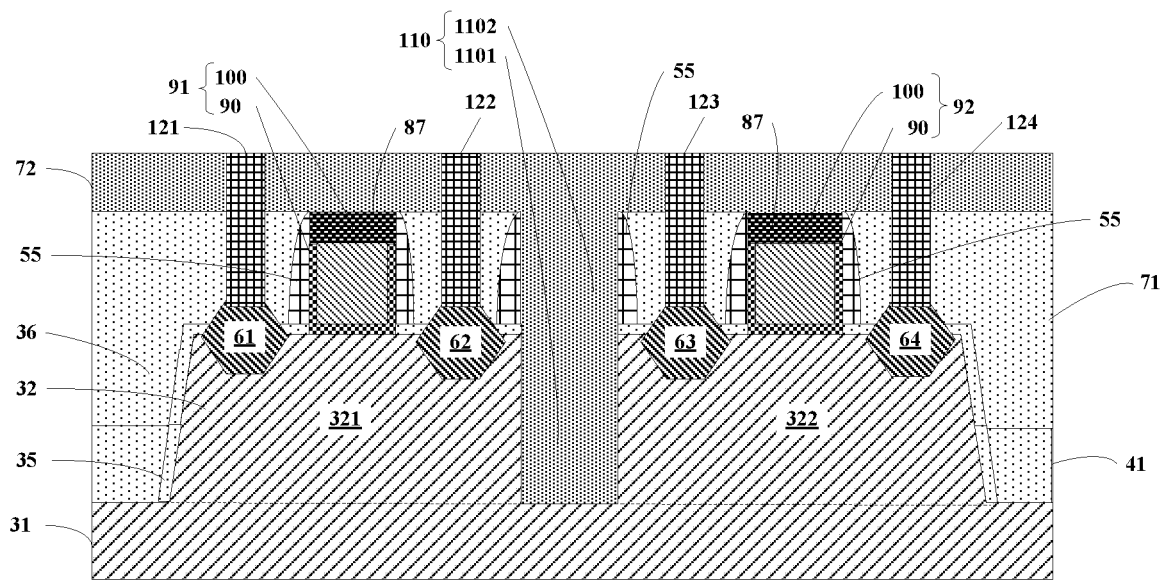
FIG. 18 is a cross-sectional view illustrating an intermediate stage of a structure of a manufacturing method of a semiconductor device after forming contacts according to an embodiment of the present invention.

Next, referring to FIG. 18, a first contact 121, a second contact 122, a third contact 123, and a fourth contact 124 are formed extending through first dielectric layer 71 and second dielectric layer 72 to connect to first electrode 61, second electrode 62, third electrode 63, and fourth electrode 64, respectively. In one embodiment, first contact 121, second contact 122, third contact 123, and fourth contact 124 each may include a metal such as tungsten.

In one embodiment, the process of forming the contacts may include etching second dielectric layer 72 and first dielectric layer 71 to form a first through-hole to first electrode 61, a second through-hole to second electrode 62, a third through-hole to third electrode 63, and a fourth through-hole to fourth electrode 64. A metal material is then deposited filling the through-holes. The metal material is then planarized using, e.g., a CMP process, to form first contact 121, second contact 122, third contact 123, and fourth contact 124.

Heretofore, a method for manufacturing a semiconductor device according to an embodiment of the present invention has been provided. In the above-described manufacturing method, after forming the gate structure, a non-recessed trench isolation structure is formed that divides the semiconductor fins into two portions and forms a FinFET device on each of the two portions.

In the above-described method, since the portions of the semiconductor fins on opposite sides of the dummy gate structure are etched to form recesses during the formation of the electrodes, the recesses have a regular or uniform shape, so that the electrodes (e.g., the second and third electrodes) formed by the epitaxial process in these recesses also have a regular or uniform shape. Thus, the above-described manufacturing method provides a relatively uniform epitaxial body electrode.

Further, in the above-described manufacturing method, the planarization process is performed on the same semiconductor fin in the process of planarizing the gate layer to form the gate, rather than planarizing the gate layer on the different fins, the gate thus formed has a uniform height.

In summary, the above-described manufacturing method of the present invention has many advantages over the convention manufacturing methods in the control of the epitaxial growth morphology and in the control of the uniform height of the gate.

It should be noted that, although the above method shows one dummy gate structure and two gate structures are formed on the same semiconductor fin, and two FinFET devices are formed after forming and filling the trenches, it is understood by those skilled in the art the number of dummy gate structures, the number of the gate structures, and the number of trenches are arbitrary chosen for describing the example embodiment and should not be limiting. Those of skill in the art will appreciate that more dummy gates, more gate structures, and more trenches may be formed to divide the semiconductor fin into more portions so that more FinFET devices can be formed. Thus, the scope of the present invention is not limited thereto.

Referring to FIG. 18, a semiconductor device manufactured according to the above-described method may include a substrate 31, a semiconductor fin 32 on substrate 31, and a first dielectric layer 71 on semiconductor fin 32. The semiconductor device also includes a trench 110 extending through semiconductor fin 32 and first dielectric layer. Trench 110 divides semiconductor fin 32 into a first portion 321 and a second portion 322. The semiconductor device further includes a second dielectric layer 72 on first dielectric layer 71 filling trench 110. The semiconductor device has a non-recessed trench isolation structure.

In one embodiment, trench 110 has a depth in the range between 2000 angstroms and 4000 angstroms, e.g., 2500 angstroms or 3000 angstroms.

In one embodiment, referring to FIG. 18, the trench may includes a first trench portion 1101 disposed between first portion 321 and second portion 322 of semiconductor fin 32 and a second trench portion 1102 over first trench portion 1101 and in first dielectric layer 71. First trench portion 1101 and second trench portion 1102 are aligned with each other. In one embodiment, first trench portion 1101 has a depth in the range between 1000 angstroms and 2000 angstroms, e.g., the depth of first trench portion 1101 may be 1500 angstroms. In one embodiment, second trench portion 1102 has a depth in the range between 1000 angstroms and 2000 angstroms, e.g., the depth of second trench portion 1102 may be 1500 angstroms.

In one embodiment, referring to FIG. 18, the semiconductor device may also include a first gate structure 91 and a second gate structure 92 on semiconductor fin 32 on opposite sides of trench 110. First gate structure 91 is on first portion 321 and second gate structure 92 is on second portion 322. First gate structure 91 and second gate structure 92 each include a gate dielectric layer 90 on semiconductor fin 32 and a gate electrode 100 on gate dielectric layer 90.

In one embodiment, referring to FIG. 18, the semiconductor device may also include a first electrode 61 and a second electrode 62 on opposite sides of first gate structure 91 and at least partially in first portion 321. The semiconductor device may further include a third electrode 63 and a fourth electrode 64 on opposite sides of second gate structure 92 and at least partially in second portion 322. In one exemplary embodiment, first electrode 61 and fourth electrode 64 may be source electrodes, and second electrode 62 and third electrode 63 may be drain electrodes.

In one embodiment, referring still to FIG. 18, the semiconductor device may also include a hardmask layer (i.e., the second hardmask layer) 87 on the upper surfaces of first gate structure 91 and second gate structure 92.

In one embodiment, referring still to FIG. 18, the semiconductor device may also include spacers 55 on opposite sides of first gate structure 91 and opposite sides of second gate structure 92. In one embodiment, spacers 55 may also be disposed on opposite sides of the portion of second dielectric layer 72 filling second recess portion 1102 that is above first recess portion 1101 in trench 110.

In one embodiment, referring still to FIG. 18, the semiconductor device may also include a first contact 121, a second contact 122, a third contact 123, and a fourth contact 124 that extend through second dielectric layer 72 and first dielectric layer 71 and connect to first electrode 61, second electrode 62, third electrode 63, and fourth electrode 64, respectively.

In one embodiment, referring still to FIG. 18, the semiconductor device may also include a trench isolation portion on substrate 31 and surrounding semiconductor fin 32. The trench isolation portion may include a recess 36 surrounding semiconductor fin 32 and a trench insulator layer 41 partially filling recess 36. First dielectric layer 71 is disposed on the trench isolation portion. In one embodiment, trench 110 has a bottom that is substantially flush with the bottom of the trench isolation portion (i.e., the bottom of recess 36).

In one embodiment, referring still to FIG. 18, the semiconductor device may also include an insulator layer (i.e., second insulator layer) 35 on a surface portion of semiconductor fin 32. Insulator layer 35 is disposed between trench insulator layer 41 and semiconductor fin 32.

A semiconductor device according to an embodiment of the present invention has been described above. The semiconductor device has a non-recessed trench isolation structure. Further, the semiconductor device has uniform epitaxial body electrodes (e.g., second and third electrodes) and gates with a uniform height.

Embodiments of the present invention have been described in detail. In order not to obscure the teachings of the present invention, some details known in the art are not described. Various of the above-disclosed and other features or alternatives thereof may be combined. Various modifications, variations or improvements therein may be made by those skilled in the art, each of which is also intended to be encompassed by the disclosed embodiments.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of manufacturing a semiconductor device, comprising:
    providing a semiconductor structure including a substrate and a semiconductor fin on the substrate;
    forming a dummy gate structure on the semiconductor fin;
    forming a first initial gate structure and a second initial gate structure on the semiconductor fin on opposite sides of the dummy gate structure, the first and second initial gate structures being spaced apart from the dummy gate structure;
    forming a first hardmask layer on the dummy gate structure and the first and second initial gate structures;
    forming spacers on sidewalls of the dummy gate structure and on sidewalls of the first and second initial gate structures;
    forming a first electrode and a second electrode on opposite sides of the first initial gate structure and a third electrode and a fourth electrode on opposite sides of the second initial gate structure, wherein the second electrode is disposed between the first initial gate structure and the dummy gate structure, and the third electrode is disposed between the second initial gate structure and the dummy gate structure;
    forming a first dielectric layer on the semiconductor structure exposing an upper surface of the dummy gate structure;
    removing the dummy gate structure and a portion of the semiconductor fin below the dummy gate structure to form a trench that divides the semiconductor fin into a first portion and a second portion spaced apart from each other;
    forming a second dielectric layer on the semiconductor structure filling the trench; and
    forming a first contact, a second contact, a third contact, and a fourth contact extending through the first dielectric layer and the second dielectric layer to connect to the first electrode, the second electrode, the third electrode, and the fourth electrode, respectively.

2. The method of claim 1, further comprising, after forming the first dielectric layer on the semiconductor structure:
    planarizing the first dielectric layer to expose the upper surface of the dummy gate structure, an upper surface of the first initial gate structure, and an upper surface of the second initial gate structure.

3. The method of claim 2, wherein:
    the dummy gate structure comprises a dummy gate insulator layer on the semiconductor fin and a dummy gate on the dummy gate insulator layer;
    the first initial gate structure comprises a first initial gate insulator layer on the semiconductor fin and a first initial gate on the first initial gate insulator layer;
    the second initial gate structure comprises a second initial gate insulator layer on the semiconductor fin and a second initial gate on the second initial gate insulator layer;
    wherein the upper surface of the dummy gate structure is an upper surface of the dummy gate, the upper surface of the first initial gate structure is an upper surface of the first initial gate, and the upper surface of the second initial gate structure is an upper surface of the second initial gate.

4. The method of claim 3, further comprising, prior to forming the trench:
    removing the first initial gate structure and the second initial gate structure to form a first recess in a location of the removed first initial gate structure and a second recess in a location of the removed second initial gate structure;
    forming a first gate structure in the first recess and a second gate structure in the second recess;
    removing a top portion of the first gate structure to form a third recess and a top portion of the second gate structure to form a fourth recess, the third recess having a depth less than a depth of the first recess, and the fourth recess having a depth less than a depth of the second recess; and
    forming a second hardmask layer on an upper surface of the first gate structure and an upper surface of the second gate structure.

5. The method of claim 4, wherein the first gate structure is disposed on the first portion, the first electrode and the second electrode being disposed in the first portion, the second gate structure is disposed on the second portion, the third electrode and the fourth electrode being disposed in the second portion.

6. The method of claim 4, wherein forming the first recess and the second recess comprises:
    forming a patterned mask layer on the first dielectric layer covering the dummy gate and exposing an upper surface of the first initial gate and an upper surface of the second initial gate;
    removing the first initial gate and the second initial gate using the patterned mask layer as a mask;
    removing the patterned mask layer;
    removing the first initial gate insulator layer and the second initial gate insulator layer to form the first recess and the second recess.

7. The method of claim 4, wherein forming the second hardmask layer comprises:
    forming the second hardmask layer filling the third recess and the fourth recess;

planarizing the second hardmask layer to expose an upper surface of the dummy gate, wherein a remaining portion of the second hardmask layer comprises a first hardmask portion disposed on the first gate structure and a second hardmask portion disposed on the second gate structure.

8. The method of claim 1, wherein the trench comprises a depth in a range between 2000 angstroms and 4000 angstroms, and a first trench portion between the first portion and the second portion and a second trench portion above the first trench portion;
wherein the first trench portion has a depth in a range between 1000 angstroms and 2000 angstroms, and the second trench portion has a depth in a range between 1000 angstroms and 2000 angstroms.

9. The method of claim 1, further comprising:
forming a trench isolation portion on the substrate and surrounding the semiconductor fin, the trench isolation portion having a bottom substantially flush with a bottom of the trench.

10. A method of manufacturing a semiconductor device, the method comprising:
providing a semiconductor structure including a substrate and a semiconductor fin on the substrate;
forming a dummy gate structure on the semiconductor fin;
forming a first initial gate structure and a second initial gate structure on the semiconductor fin on opposite sides of the dummy gate structure, the first and second initial gate structures being spaced apart from the dummy gate structure;
forming a first dielectric layer on the semiconductor structure exposing an upper surface of the dummy gate structure, an upper surface of the first initial gate structure, and an upper surface of the first initial gate structure;
removing a top portion of the first and second initial gate structures but not a top portion of the dummy gate structure to form a recess;
forming a hardmask layer on the recess; and
removing the dummy gate structure and a portion of the semiconductor fin below the dummy gate structure to form a trench that divides the semiconductor fin into a first portion and a second portion spaced apart from each other.

11. The method of claim 10, wherein forming the hardmask layer on the recess comprises:
forming the hardmask layer overlying the first dielectric layer, the dummy gate structure, the first and second initial gate structures; and
planarizing the hardmask layer to expose an upper surface of the dummy gate structure while keeping a remaining portion of the hardmask layer in the recess.

12. The method of claim 10, further comprising:
forming a trench isolation portion on the substrate and surrounding the semiconductor fin, the trench isolation portion having a bottom substantially flush with a bottom of the trench.

13. The method of claim 10, further comprising:
forming a second dielectric layer on the semiconductor structure filling the trench to form a non-recessed trench isolation structure.

14. The method of claim 13, further comprising:
forming a first electrode and a second electrode on opposite sides of the first initial gate structure and a third electrode and a fourth electrode on opposite sides of the second initial gate structure.

15. The method of claim 14, wherein the second electrode is disposed between the first initial gate structure and the non-recessed trench isolation structure, and the third electrode is disposed between the second initial gate structure and the non-recessed trench isolation structure.

16. The method of claim 14, further comprising:
forming first, second, third, and fourth contacts extending through the first and the second dielectric layers to connect to the first, second, third, and fourth electrodes, respectively.

17. The method of claim 14, further comprising:
performing an etching process to the first and second dielectric layers to form a plurality of through-holes to the first, second, third, and fourth electrodes; and
forming a metal material layer filling the through-holes.

18. The method of claim 17, further comprising:
planarizing the metal material layer so that a planarized metal material layer is flush with an upper surface of the second dielectric layer.

19. The method of claim 10, further comprising:
forming spacers on sidewalls of the dummy gate structure and the first and second initial gate structures, wherein removing the top portion of the first and second initial gate structures but not the top portion of the dummy gate structure does not remove the spacers.

* * * * *